United States Patent
Cosand

(12) United States Patent (10) Patent No.: US 7,940,201 B1
Cosand (45) Date of Patent: May 10, 2011

(54) PHOTONIC ANALOG TO DIGITAL CONVERTER INPUT SAMPLER

(75) Inventor: Albert E. Cosand, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 25 days.

(21) Appl. No.: 12/497,448

(22) Filed: Jul. 2, 2009

(51) Int. Cl.
*H03M 1/00* (2006.01)

(52) U.S. Cl. ......................................... 341/122; 341/155

(58) Field of Classification Search .................. 341/122, 341/155
See application file for complete search history.

(56) References Cited

U.S. PATENT DOCUMENTS

| | | | | |
|---|---|---|---|---|
| 5,172,117 | A * | 12/1992 | Mills et al. | 341/157 |
| 5,367,154 | A * | 11/1994 | Pfeiffer | 250/208.1 |
| 6,455,839 | B1 * | 9/2002 | O'Connor et al. | 250/221 |
| 7,136,005 | B1 * | 11/2006 | Lyden et al. | 341/166 |
| 7,247,832 | B2 * | 7/2007 | Webb | 250/214 R |

\* cited by examiner

*Primary Examiner* — Khai M Nguyen

(74) *Attorney, Agent, or Firm* — George R. Rapacki; Daniel R. Allemeier

(57) ABSTRACT

An input sampler interface to a track and hold circuit that decouples a high bandwidth (possibly optical domain) input signal from a lower bandwidth electrical domain of a subsequent track and hold circuit or other circuit.

16 Claims, 3 Drawing Sheets

PHOTONIC ANALOG TO DIGITAL CONVERTER INPUT SAMPLER

STATEMENT REGARDING FEDERALLY SPONSORED RESEARCH OR DEVELOPMENT

This invention was made with Government support under Contract No. H98230-05-C-0472. The Government has certain rights in the invention.

TECHNICAL FIELD

This application is directed to decoupling the bandwidth of an input pulse, either electrical or optical, from the bandwidth of a subsequent circuit. The subsequent circuit may be a track and hold circuit that is itself the front end of an analog to digital converter.

BACKGROUND

This invention describes a method and apparatus for capturing the information in a short pulse. Generally the pulse is electrical or an optical pulse passed through a photo detector. Generally the pulse is the input to a lower bandwidth, electrical domain, analog to digital converter.

Ordinarily, an optical signal is directed to a photo detector and the photo detector output is sent to a track and hold circuit. The track and hold circuit output is the input to an analog to digital converter. After each conversion of the track and hold output, a new sample of the input is captured by the track and hold. In terms of bandwidth, a short input optical pulse requires the track and hold circuit to have a bandwidth inversely proportional to the duration of the input pulse. For a 5 picosecond input pulse, the bandwidth of the track and hold is approximately 200 GHz. Such a broad bandwidth presents its own design issues. In particular a broad bandwidth incurs a substantial penalty in signal to noise ratio.

A continuous time delta-sigma analog to digital converter can efficiently capture the information from a photonic sampler, but such Analog to Digital Converters (ADC) have limited bandwidth. A simple integrating sampler can capture the information from a photonic sampler but is a poor match to the quantizer portion of an ADC because the fraction of the sample period during which the integrator can drive the quantizer is limited by the time required to reset the integrator between samples. Alternatively, a peak detector in place of an integrator could be used but its bandwidth would be on the order of the input pulse duration with the commensurate noise such a bandwidth implies.

There is a need for an interface circuit that will capture the information in the input pulse and preserve it for the track and hold circuit, without the track and hold circuit having a bandwidth dictated by the duration of the pulse.

SUMMARY

The problem of the track and hold circuit having enough bandwidth, such that it can capture a fast electrical pulse or the output of a photo detector driven by an optical pulse, is overcome by using a sampler, controlled independently of the track and hold circuit, to decouple the bandwidth of the track and hold circuit from the bandwidth of the input pulse. In some embodiments the sampler is an integrator. In other embodiments the sampler may be a peak detector.

In a first embodiment, a photonic analog to digital converter sampler apparatus comprising: a sampler; wherein the sampler is enabled by an sampler enable signal and reset by an sampler reset signal; an output of the sampler is connected to an input of a subsequent circuit; wherein the subsequent circuit is controlled by a subsequent circuit enable signal. The sampler enable, sampler reset and subsequent circuit enable signals are synchronized to decouple the bandwidth of the subsequent circuit from the bandwidth of an input pulse to the sampler.

In a second embodiment, the invention of the first embodiment further comprising an amplifier amplifying the input to the sampler.

In a third embodiment, the invention of the first embodiment where the sampler is an integrator.

In another embodiment, the invention of the third embodiment further comprising a photo detector where the photo detector converts an optical pulse to an electrical pulse for either the sampler or an amplifier.

In another embodiment, the invention of the first embodiment where the subsequent circuit is a track and hold circuit.

In another embodiment, a method for decoupling the bandwidth of a subsequent circuit from an optical input comprising: converting the optical input pulse into an electrical signal; sampling the electrical signal wherein the sampler is controlled by a sampler enable signal and reset by a sampler reset signal; capturing the output of the sampler in response to a subsequent circuit enable signal. The subsequent circuit may be a track and hold circuit.

In another embodiment, the method of the previous embodiment wherein the sampler is an integrator.

In another embodiment, the method further comprising amplifying the electrical signal and passing the amplified electrical signal to the sampler.

DESCRIPTION OF THE DRAWINGS

The objects, features and advantages of the invention will be apparent from the following detailed description of the preferred embodiments of the invention in conjunction with reference to the following drawings where.

DESCRIPTION

Figure 1:
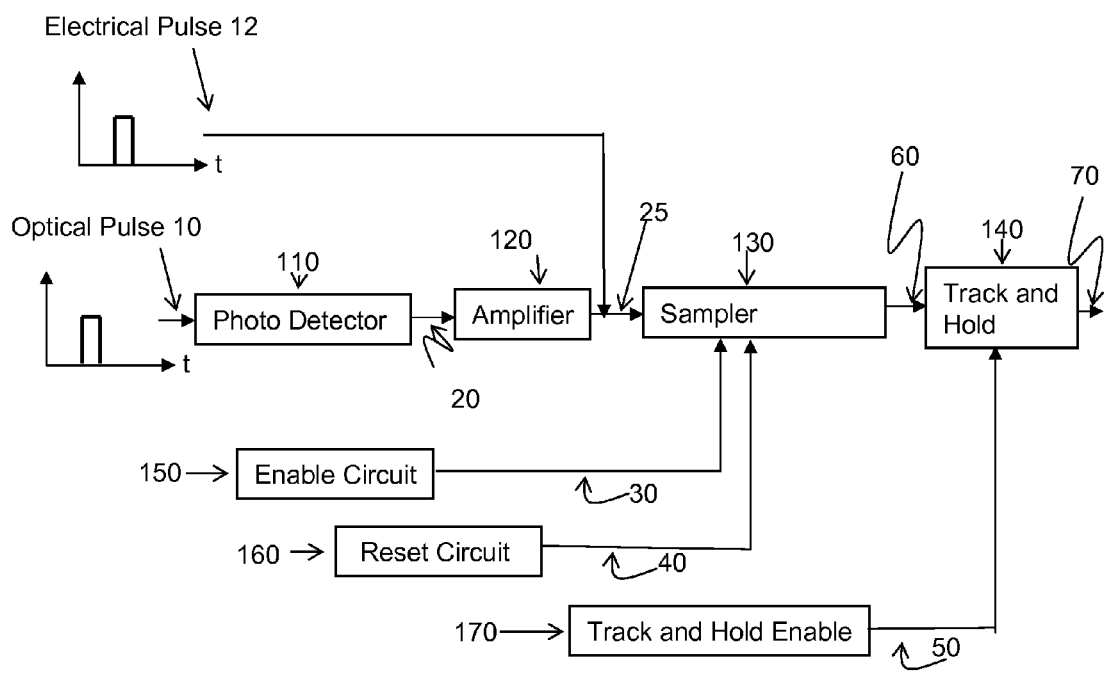
FIG. 1 shows a block diagram of the Photonic Analog to Digital Input Sampler

The following description is presented to enable one of ordinary skill in the art to make and use the invention and to incorporate it in the context of particular applications. Various modifications, as well as a variety of uses in different applications will be readily apparent to those skilled in the art, and general principles defined herein may be applied to a wide range of embodiments. Thus the invention is not intended to be limited to the embodiments presented, but is to be accorded the widest scope consistent with the principles and novel features disclosed herein.

In the following detailed description, numerous specific details are set forth in order to provide a more thorough understanding of the invention. However, it will be apparent to one skilled in the art that the invention may be practiced without necessarily being limited to specific details. In other instances, well-known structures and devices are shown in block diagram form, rather than in detail, in order to avoid obscuring the present invention.

All features disclosed in this specification, (including any accompanying claims, abstract, and drawings) may be replaced by alternative features serving the same, equivalent or similar purpose, unless expressly stated otherwise. Unless expressly stated otherwise, each feature disclosed is one example only of a generic series of equivalents or similar features.

The drawings and accompanying descriptions are meant to provide the structure for the function performed by the components described in the drawings and accompanying descriptions.

Any element in a claim that does not explicitly state "means for" performing a specified function, or "step for" performing a specific function, is not to be interpreted as a "means" or "step" clause as specified in 35 USC Section 112, Paragraph 6. In particular, the use of step of or act of in the claims herein is not intended to invoke the provisions of 35 USC Section 112 Paragraph 6.

One alternative to a broad bandwidth track and hold circuit is to use a sampler between the optical signal and the track and hold circuit. By controlling the sampler, such that it is switched on when an optical pulse is expected but not reset until the track and hold circuit has finished with its task, the bandwidth of the track and hold circuit can be substantially decoupled from the optical pulse duration. This is because the sampler alone needs time to accomplish its reset operation. The preferred embodiment uses an integrator as the input sampler to integrate the input optical pulse and preserve it for the track and hold circuit. A person skilled in the art will realize that other circuits than an integrator may be used as a sampler as long as the alternative circuit may be enabled by one signal and reset by another.

As shown in FIG. 1, the optical signal 10 typically drives a Photo Detector circuit 110. The Photo Detector 110 circuit may be implemented with photo diodes, photo transistors, photo resistors or similar devices. However implemented, the Photo Detector has its own capacitance and resistance which acts as a low pass filter on the electrical equivalent of the optical pulse 10. The output 20 of the Photo Detector 110 circuit may pass through an optional Amplifier 120 before driving the Sampler 130. The Amplifier 120 may supply the gain to drive the Sampler and improve the signal to noise ratio. The Sampler circuit 130 has two controls, an Enable 30 and an Reset 40 generated by an Enable Circuit 150 and an Reset Circuit 160 respectively. The Enable 30 may cause the Sampler 130 to integrate the Amplifier output 25. The Reset 40 will cause the Sampler 130 to reset to its initial value upon receipt. The output 60 of the Sampler 130 is captured by a Track and Hold circuit 140. The Track and Hold circuit 140 is controlled by the Track and Hold Enable circuit 170 that generates the Track and Hold Enable signal 50. Upon receipt of the Track and Hold Enable signal 50 the Track and Hold Circuit 140 will capture a new value and present that value on its output 70 to the subsequent analog to digital converter (not shown).

Various implementations of the Track and Hold circuit 140 are possible and most will be compatible with the present design as long as the Track and Hold circuit 140 is controlled by a Track and Hold Enable signal 50 and the bandwidth of the Track and Hold circuit 140 is at least approximately equal to the reciprocal of the Track and Hold Enable signal 50 period.

Figure 2:
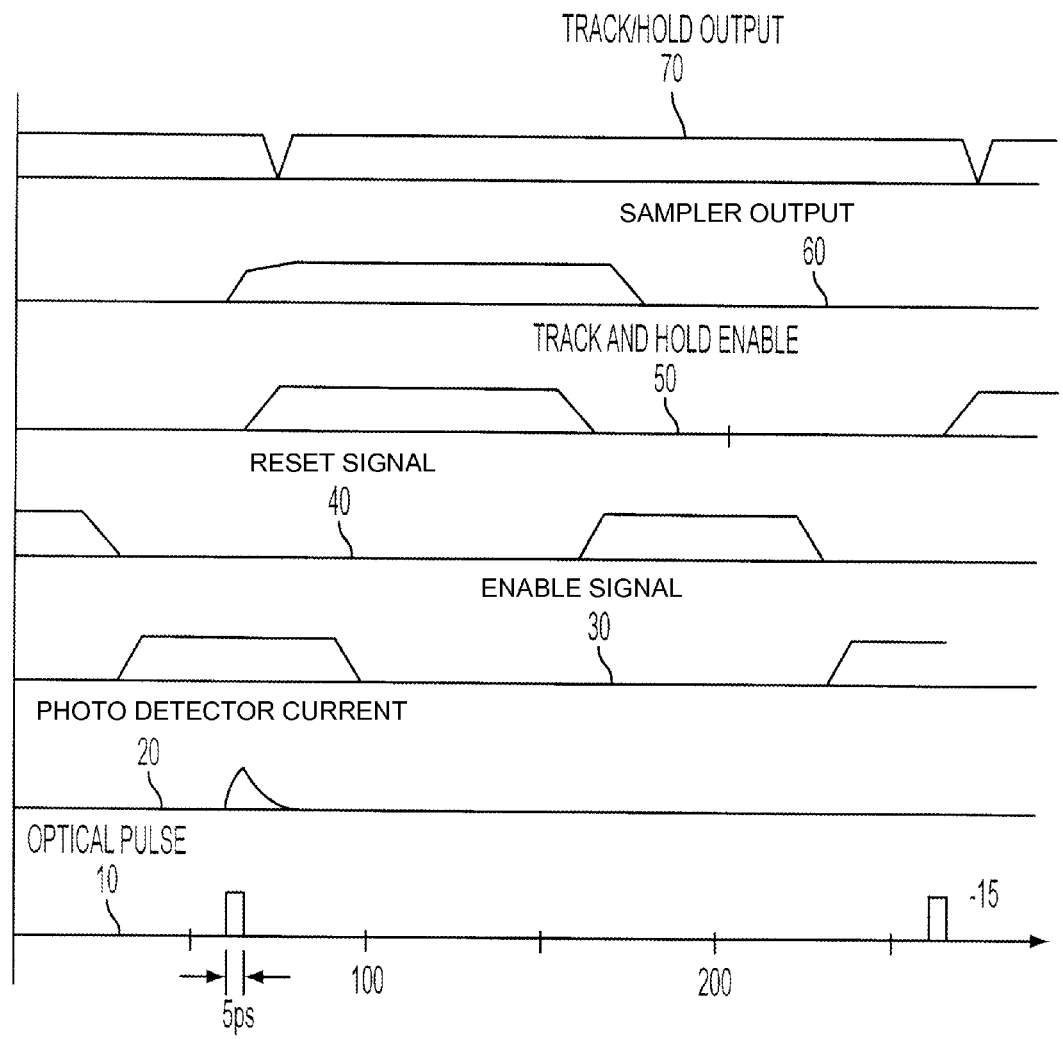
FIG. 2 illustrates the timing of the Photonic Analog to Digital Input Sampler.

The timing interrelationships between the components and signals of FIG. 1, is shown in FIG. 2. The input optical pulse 10 duration, without implying a limitation, is on the order of 5 picoseconds. The output 20 of the Photo Detector 110 shows the low pass filtering effect of the photo detector's capacitance and resistance. The Enable 30 is synchronized with the Photo Detector output 20 such that the Sampler 130 may integrate the output 20 of the Photo Detector or if an Amplifier 120 is used, the output 25 of the Amplifier 120. Alternatively the Sampler 130 may capture the peak of the output 25 of the Amplifier 120.

In an alternative embodiment, as shown in FIG. 1, the Sampler 130 captures an electrical pulse 12 instead of an optical pulse 10.

The Sampler 130 output 60 is shown in FIG. 2. The Sampler 130 output 60 persists until the Reset signal 40 is received. The Track and Hold Enable signal 50 is synchronized with the Reset 40 and Enable 30 signals but offset in phase such that the Track and Hold circuit 140 can capture the Sampler 130 output 60. Every occurrence of the Track and Hold Enable signal 50 causes the Track and Hold circuit 140 to capture a new value of the Sampler 130 output 60 as Track and Hold output 70 for the subsequent analog to digital converter (not shown). Since the Sampler 130 presents a signal 60 to the Track and Hold 140 that persists until the Reset signal 40 arrives and is not dependent on the duration of the Optical Pulse 10 or the Electrical Pulse 12, the Track and Hold 140 circuit does not need a bandwidth commensurate with the Optical Pulse 10 or the Electrical Pulse 12, but rather commensurate with a bandwidth with the Track and Hold Enable signal 50. In effect, the bandwidth of the Track & Hold circuit 140 is decoupled from the bandwidth of the input Optical Pulse 10 or the input Electrical Pulse 12.

That the bandwidth of the Track and Hold circuit 140 is decoupled from the input Optical Pulse 10 is seen by comparing the period of the Track and Hold Enable signal 50 with the duration of the Optical Pulse 10. The values shown in FIG. 2 are illustrative and not intended to be limiting. The bandwidth of the Track and Hold circuit 140 is approximately ½60 ps or 3.8 GHz. The input Optical Pulse has a bandwidth of approximately 200 GHz.

Figure 3:
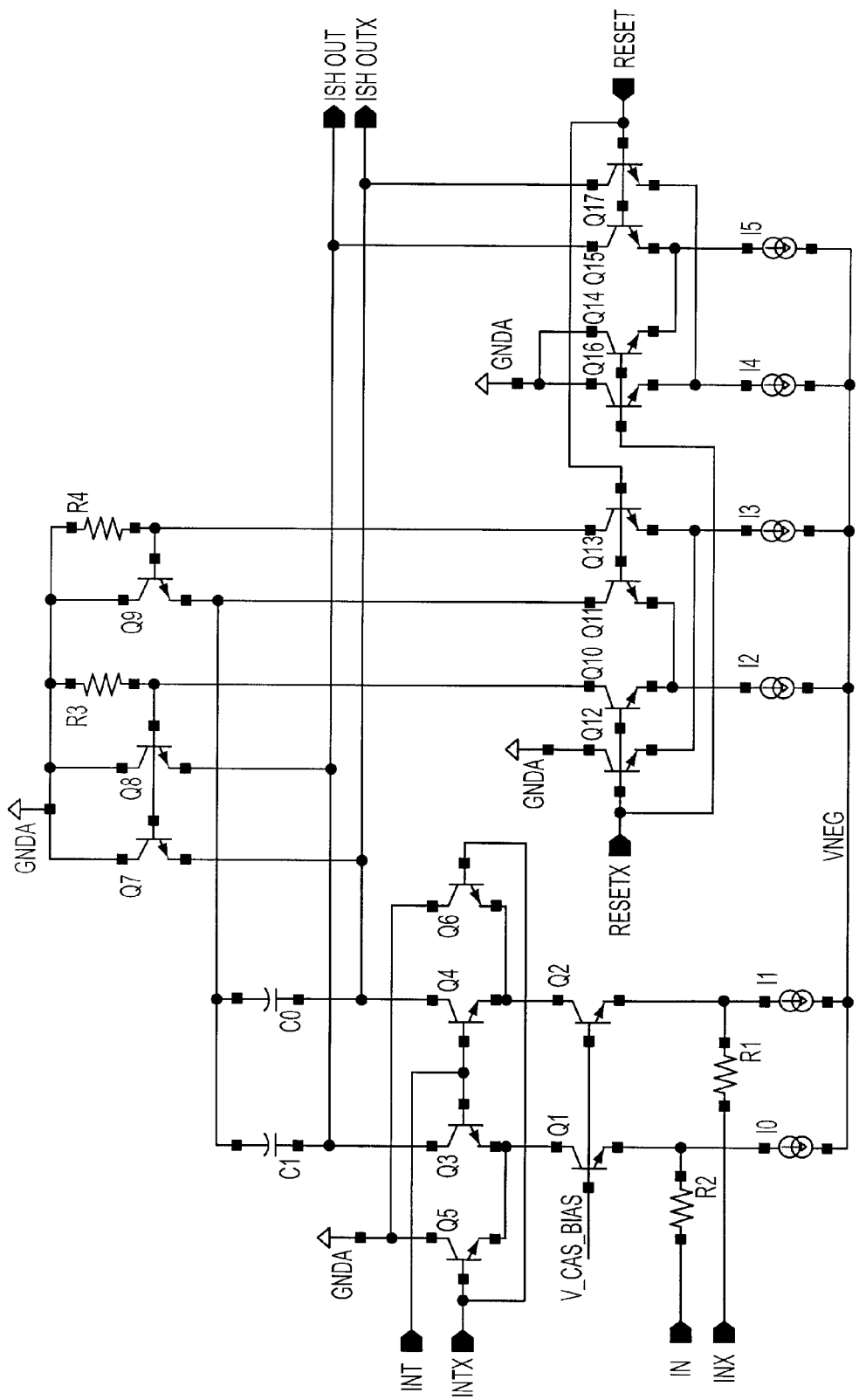
FIG. 3 illustrates an embodiment of the Photonic Analog to Digital Input Sampler

FIG. 3 shows an embodiment of the Sampler circuit invention as an integrator implemented with bipolar transistors and capacitors CO and Cl. One skilled in the art will realize different technologies will allow for functionally comparable circuits of greater or less complexity. For example, the integrator reset circuitry comprising bipolar transistors Q7 through Q17 may be replaced by one or more field effect transistors. The implementation shown in FIG. 3 is not meant to imply any limitation to a particular technology.

What is claimed is:

1. An apparatus comprising:
   a sampler;
   wherein the sampler is enabled by a sampler enable signal and reset by a sampler reset signal;
   an output of the sampler is connected to an input of a subsequent circuit;
   wherein the subsequent circuit is controlled by a subsequent enable signal;
   and wherein the sampler enable signal, the sampler reset signal and the subsequent enable signal are synchronized in such a way that the bandwidth of the subsequent circuit is decoupled from the bandwidth of an input pulse to the sampler.

2. The apparatus of claim 1 further comprising an amplifier providing an amplified input pulse to the sampler.

3. The apparatus of claim 1 wherein the sampler is an integrator such that the sampler integrates an input pulse upon receipt of the sampler enable signal and resets the sampler upon receipt of the sampler reset signal.

4. The apparatus of claim 3 further comprising a photo detector wherein the photo detector output is the input pulse.

5. The apparatus of claim 4 further comprising an amplifier amplifying the photo detector output and providing the input pulse.

6. The apparatus of claim 1 wherein the subsequent circuit is a track and hold circuit operating on the output of the sampler upon each occurrence of the subsequent enable signal.

7. A sampler apparatus comprising:
   means for converting an input pulse into an electrical output pulse;
   means for sampling the electrical output pulse;
   wherein the means for sampling is enabled by a sampler enable signal and reset by a sampler reset signal;
   means for capturing the output of the means for sampling;
   wherein the means for capturing is enabled by a subsequent enable signal; and
   wherein the sampler enable signal, the sampler reset signal and the subsequent enable signal are synchronized in such a way that the bandwidth of the means for capturing is decoupled from the bandwidth of the input pulse.

8. The sampler apparatus of claim 7 wherein the means for sampling comprises means for integrating.

9. The sampler apparatus of claim 8 wherein the means for converting an input pulse into an electrical output pulse is a photo detector.

10. The sampler apparatus of claim 9 further comprising means for amplifying the electrical output pulse wherein an output of the means for amplifying is sampled by the means for sampling.

11. A method for decoupling a bandwidth of a capture circuit from a bandwidth of an input pulse comprising:
   converting the input pulse into an electrical signal;
   sampling the electrical signal with a sampler, wherein the sampler is controlled by a sampler enable signal and reset by a sampler reset signal;
   capturing an output of the sampler circuit in a capture circuit in response to a capture enable signal; and
   wherein the capture enable signal, the sampler reset signal and the sample enable signal operate in such a way that the bandwidth of the capture circuit is independent of the bandwidth of the input pulse.

12. The method of claim 11 wherein the sampler is an integrator.

13. The method of claim 11 wherein the capture circuit is a track and hold circuit.

14. A method of providing a sampled electrical pulse to a track and hold circuit comprising:
   converting an input pulse into an electrical pulse;
   sampling the electrical pulse with a sampler wherein the sampler resets in response to a sampler reset signal and samples the electrical pulse in response to a sampler enable signal; and
   capturing an output of the sampler with a track and hold circuit wherein the track and hold circuit responds to a track and hold circuit enable signal;
   wherein the track and hold enable signal enables the track and hold circuit no sooner than the sampler enable signal enables the sampler and ends before or at the occurrence of the sampler reset signal.

15. The method of claim 14 further comprising amplifying the electrical pulse before passing on the electrical pulse to the sampler.

16. The method of claim 14 wherein the sampler is an integrator.

* * * * *